United States Patent
Pines et al.

(10) Patent No.: US 7,439,738 B2
(45) Date of Patent: Oct. 21, 2008

(54) NUCLEAR MAGNETIC RESONANCE DETECTION IN INHOMOGENEOUS MAGNETIC FIELDS

(75) Inventors: Alexander Pines, Berkeley, CA (US); Daniel Topgaard, Hastveda (SE); Dimitrios Sakellariou, Boulogne Billancourt (FR); Rachel W. Martin, Irvine, CA (US); Carlos A. Meriles, Fort Lee, NJ (US)

(73) Assignee: The Regents of The University of California, Oakland, CA (US)

( * ) Notice: Subject to any disclaimer, the term of this patent is extended or adjusted under 35 U.S.C. 154(b) by 0 days.

(21) Appl. No.: 11/625,209

(22) Filed: Jan. 19, 2007

(65) Prior Publication Data

US 2007/0194788 A1 Aug. 23, 2007

Related U.S. Application Data

(63) Continuation of application No. PCT/US2005/026229, filed on Jul. 21, 2005.

(60) Provisional application No. 60/590,581, filed on Jul. 22, 2004, provisional application No. 60/609,032, filed on Sep. 9, 2004.

(51) Int. Cl.
  *G01V 3/00* (2006.01)
(52) U.S. Cl. ....................................... 324/307
(58) Field of Classification Search ................ 324/307, 324/309
  See application file for complete search history.

(56) References Cited

U.S. PATENT DOCUMENTS

| 5,233,991 | A | 8/1993 | Wright |
| 5,289,127 | A | 2/1994 | Doddrell et al. |
| 5,304,930 | A | 4/1994 | Crowley et al. |
| 5,798,643 | A * | 8/1998 | Werthner ............. 324/309 |
| 5,935,065 | A | 8/1999 | Rose, Jr. et al. |
| 6,489,767 | B1 | 12/2002 | Prado et al. |
| 6,570,383 | B1 * | 5/2003 | McKinnon et al. ......... 324/314 |
| 6,618,607 | B2 | 9/2003 | Song |
| 6,674,282 | B2 | 1/2004 | Pines et al. |
| 6,819,108 | B2 * | 11/2004 | Huang et al. ............. 324/320 |
| 2003/0052677 | A1 * | 3/2003 | Pines et al. ............. 324/307 |

FOREIGN PATENT DOCUMENTS

WO WO 02/082116 10/2002

OTHER PUBLICATIONS

International Search Report and Written Opinion received in Intl. Appln. No. PCT/US05/26229, mailed May 5, 2006.
Chen N.K. et al., "Removal of Intravoxel Dephasing Artifact in Gradient-Echo Images Using a Field-Map Based RF Refocusing Technique," *Magnetic Resonance in Medicine*, 42:807-812 (1999).

(Continued)

*Primary Examiner*—Brij B. Shrivastav
*Assistant Examiner*—Megann E Vaughn
(74) *Attorney, Agent, or Firm*—Knobbe Martens Olson & Bear LLP (57) ABSTRACT

Methods and systems for compensating for static magnetic field inhomogeneities during nuclear magnetic resonance detection are disclosed. Application of radio frequency pulses and/or magnetic field gradients may be used to correct for spin dephasing caused by the inhomogeneities. The methods and system may be used to improve signal-to-noise ratios in NMR and MRI systems where magnetic field inhomogeneity may have an effect.

30 Claims, 10 Drawing Sheets

OTHER PUBLICATIONS

Glover, Gary H., "3D z-Shim Method for Reduction of Susceptibility Effects in Bold fMRI," *Magnetic Resonance in Medicine*, 42:290-299 (1999).

Sakellariou, D., et al., "Variable rotation composite pulses for high resolution nuclear magnetic resonance using inhomogeneous magnetic and radiofrequency fields," *Chem. Phys. Lett.* 363:25-33 (2002).

Tannus A., et al., "Adiabatic Pulses," *NMR in Biomedicine*, pp. 423-434, 1997.

Topgaard, D., et al. "'Shim pulses' for NMR spectroscopy and imaging," *Proc. Natl. Acad. Sci.*, vol. 101, No. 51, p. 17576-17581, Dec. 21, 2004.

Meriles, et al., "Approach to High-Resolution ex Situ NMR Spectroscopy," *Science*, vol. 293, p. 83-85, 2001.

Balbach et al., "High-Resolution NMR in Inhomogeneous Fields", Chemical Physics Letters, vol. 277, p. 367-374 (Oct. 1997).

Balibanu et al., "Nuclear Magnetic Resonance in Inhomogeneous Magnetic Fields", Journal of Magnetic Resonance, vol. 145, p. 246-258 (2000).

Garbow et al., "Total Spin Coherence Transfer Echo Spectroscopy", Journal of Chemical Phyics, vol. 79 (No. 11) p. 5301-5310 (Dec. 1983).

Garwood et al., "The Return of the Frequency Sweep: Designing Adiabatic Pulses for Contemporary NMR", Journal of Magnetic Resonance, vol. 153, p. 155-177 (2001).

Gochin et al., "A Sharp Method for High-Resolution NMR of Heteronuclear Spin Systems in Inhomogeneous Fields", Journal of Magnetic Resonance, vol. 63, p. 431-437 (1985).

Hall et al., "Measurement of High-Resolution NMR Spectra in an Inhomogeneous Magnetic Field", Journal of the American Chemical Society, vol. 109, p. 7579-7581 (1987).

Heise et al., "Two-Dimensional High-Resolution NMR Spectra in Matched B0 and B1 Field Gradients", Journal of Magnetic Resonance, vol. 156, p. 146-151 (2002).

Meriles et al., "Broadband Phase Modulation by Adiabatic Pulses", Journal of Magnetic Resonance, vol. 164, p. 177-181 (2003).

Meriles et al., "Resolved Magic-Angle Spinning of Anisotropic Samples in Inhomogeneous Fields", Chemcial Physics Letters, vol. 358, p. 391-395 (2002).

Sakellariou et al., "High-Resolution NMR of Anisotropic Samples with Spinning Away From the Magic Angle", Chemical Physics Letters, vol. 377, p. 333-339 (2003).

Vathyam et al., "Homogeneous NMR Spectra in Inhomogeneous Fields", Science, vol. 272, p. 92-96 (Apr. 1996).

Weitekamp et al., "High-Resolution NMR Spectra in Inhomogeneous Magnetic Fields: Application of Total Spin Coherence Transfer Echoes", vol. 103, p. 3578-3579 (1981).

* cited by examiner

NUCLEAR MAGNETIC RESONANCE DETECTION IN INHOMOGENEOUS MAGNETIC FIELDS

RELATED APPLICATIONS

This application is a continuation of co-pending Application No. PCT/US2005/026229, filed Jul. 21, 2005, which is a non-provisional of both 60/590,581, filed Jul. 22, 2004, and 60/609,032, filed Sep. 9, 2004 all of which are incorporated herein by reference in their entireties.

BACKGROUND OF THE INVENTION

1. Field of the Invention

This invention pertains generally to NMR and MRI, and more particularly to a method and apparatus for NMR and MRI in inhomogeneous magnetic fields.

2. Description of the Related Art

Modern NMR spectroscopy and MRI require highly homogeneous strong magnetic fields. This leads to physically large and expensive super-conducting magnets. In NMR, highly homogeneous magnets (superconducting, permanent magnets or electromagnets) are used in order to detect the Free Induction Decay (FID) of the nuclear magnetization. The frequency and the intensity of this signal is proportional to the applied magnetic field. In an inhomogeneous magnetic field the magnetization dephases because of different precession frequencies in different parts of the sample. Field inhomogeneities lead to line broadening, poor signal-to-noise ratio, and loss of spectral information. For this reason special effort is made in the construction of electromagnetic coils (shims) which are used in order to render the original magnetic field as homogeneous as possible over the detected sample volume. The excitation and detection of the FID is made using a radio-frequency (RF) coil also having very good homogeneity. RF inhomogeneities have been traditionally seen as sources of imperfection in excitation, inversion and decoupling, leading to spectral artifacts and poor signal-to-noise ratios.

The following publications provide additional background information and are incorporated herein by reference in their entirety:

High-resolution NMR of anisotropic samples with spinning away from the magic angle, 377, 333-339 (2003), *Chem. Phys. Lett* (D. Sakellariou, C. A. Meriles, R. W. Martin and A. Pines).

Broadband Phase Modulation by Adiabatic Pulses, *Journal of Magnetic Resonance*, 164, 177181 (2003), (C. A. Meriles, D. Sakellariou and A. Pines).

Variable Rotation Composite Pulses for High Resolution Nuclear Magnetic Resonance Using Inhomogeneous Magnetic and Radiofrequency Fields *Chem. Phys. Lett.*, 363, 25-33 (2002) (Dimitris Sakellariou, Carlos Andres Meriles, Adam Moule and Alexander Pines).

2-Dimensional High-Resolution NMR Spectra in Matched $B_0$ and $B_1$ Field Gradients, *J. Magn. Reson.* 156 (1), 146-151 (2002) (Henrike Heise, Dimitris Sakellanou, Carlos Meriles, Adam Moule and Alexander Pines).

Resolved magic-angle spinning of anisotropic samples in Inhomogeneous Fields, *Chem. Phys. Lett.* 358 (5,6), 391-395 (2002) (Carlos Andres Meriles, Dimitris Sakellariou and Alexander Pines).

Nuclear Magnetic Resonance in inhomogeneous magnetic fields, *J. Magn Reson.*, 145, 246-258, (2000), (F. Balibanu, K. Hailu, D. E. Demco, and B. Blumich).

Approach to High-Resolution Ex-Situ NMR Spectroscopy, *Science*, 293, No. 5527, 82-85 2001 (Carlos Meriles, Dimitris Sakellariou, Henrike Heise, Adam Moule, Alexander Pines).

High resolution NMR in Inhomogeneous fields, *J. Magn. Res.*, 145, 246-258, (2000), (J. J. Balbach, M. S. Conradi, D. P. Cistola, C. Tang, J. R. Garbow and W. C. Hutton).

Homogeneous NMR Spectra in Inhomogeneous Fields, *Science*, 272, 92-96, (1996), (S. Vathyam, S. Lee and W. S. Warren).

Measurement of High-Resolution NMR spectra in a inhomogeneous magnetic field, *J. Am. Chem. Society*, 109, 7579-7581, (1987) (L. D. Hall, T. J. Norwood).

A SHARP Method for High Resolution NMR of Heteronuclear Spin Systems in Inhomogeneous Fields, *J. Magn. Reson.*, 63, 431-437 (1985) (M. Gochin, D. P. Weitekamp, and A. Pines).

Total Spin Coherence Transfer Echo Spectroscopy, J. Chem. Phys. 79, 5301-5310 (1983) (J. R. Garbow, D. P. Weitekamp, and A. Pines).

High Resolution NMR in Inhomogeneous Magnetic Fields: Application of Total Spin Coherence Transfer Echoes, *J. Am. Chem. Soc.*, 103, 3578-3579 (1981) (D. P. Weitekamp, J. R. Garbow, J. B. Murdoch, and A. Pines).

SUMMARY OF THE INVENTION

One embodiment disclosed herein includes a method for detecting nuclear magnetic resonance of a sample in magnetic fields having at least about 0.5 ppm inhomogeneity in static magnetic field strength, including applying a radio frequency pulse comprising a time-varying frequency to the sample and simultaneously applying a magnetic field gradient to the sample.

Another embodiment disclosed herein includes a method for improving detection of a nuclear magnetic resonance signal from a sample in an inhomogeneous static magnetic field within a volume substantially enclosed by a magnet, including applying one or more z-rotation radio frequency pulses spatially matched to the static magnetic field so as to generate a nutation echo maxima.

Another embodiment disclosed herein includes a method for improving detection of a nuclear magnetic resonance signal from a sample in an inhomogeneous static magnetic field within a volume substantially enclosed by a magnet, including applying a first radio frequency inversion pulse, applying a magnetic field gradient spatially matched to the static magnetic field, and applying a second radio frequency inversion pulse.

Another embodiment disclosed herein includes a system for improving detection of a nuclear magnetic resonance signal from a sample in an inhomogeneous static magnetic field, including a radio frequency coil, one or more magnetic field generating coils, a first current generating module coupled to the radio frequency coil, and at least one second current generating module coupled to at least one of the magnetic field generating coils, wherein the first and second current generating modules are adapted to apply currents through the coils so that a radio frequency pulse and magnetic field gradient are applied in such a manner that effects of inhomogeneity in the static magnetic field are substantially counteracted.

Another embodiment disclosed herein includes a system for detecting a magnetic resonance signal, including means for applying a static magnetic field to a sample, means for counteracting effects of inhomogeneity in the static magnetic field, and means for detecting a magnetic resonance signal from the sample.

Another embodiment disclosed herein includes a system for improving detection of a nuclear magnetic resonance signal from a sample in an inhomogeneous static magnetic field as substantially shown and described.

DETAILED DESCRIPTION OF THE PREFERRED EMBODIMENT

In various embodiments, methods and systems are provided for detecting nuclear magnetic resonance signals in inhomogeneous static magnetic fields. In some embodiments, the methods and systems may be used to improve the signal-to-noise ratio in currently available NMR and MRI. For example, higher resolution NMR spectra can be obtained. Additionally, the useful sample volume for NMR can be increased. Furthermore the time needed to render a magnet more homogeneous can be minimized. The methods and systems may also offer significant advantages in cases where a signal needs to be acquired very rapidly (e.g., no time for classical shimming of the magnet). Another possible application is with very high field magnets (proton Larmor frequency higher than 1 Ghz), which are not able to provide enough homogeneity in order to perform high-resolution NMR. In other embodiments, the methods and systems may be used in NMR and MRI systems utilizing less expensive magnets that generate less homogeneous magnetic fields. In some embodiments, NMR and MRI systems may be used that contain little or no shim magnets or shim magnets consisting of permanent non-adjustable magnets. In some embodiments, the methods and systems disclosed herein may be used in conjunction with magnets where the sample being analyzed is not within a volume substantially enclosed by the magnet. Thus, more flexible magnet geometry is possible.

The methods and systems disclosed herein can be used for analytical purposes for higher resolution NMR spectroscopy of various molecules. Higher resolution can be used to obtain enhanced structural and dynamic information, identification and product control. The methods may be particularly useful for detecting insensitive nuclei, such as carbon-13, nitrogen-15 and others present in bio-organic and inorganic materials. The same rationale allows for the acquisition of many samples inside the same magnet at the same time, leading to high-throughput NMR. A significant gain in acquisition time and thus in signal-to-noise ratio can be obtained. Also the time and procedure necessary to render a magnet homogeneous (shimming) could be greatly enhanced by the methods disclosed herein.

Figure 1A:
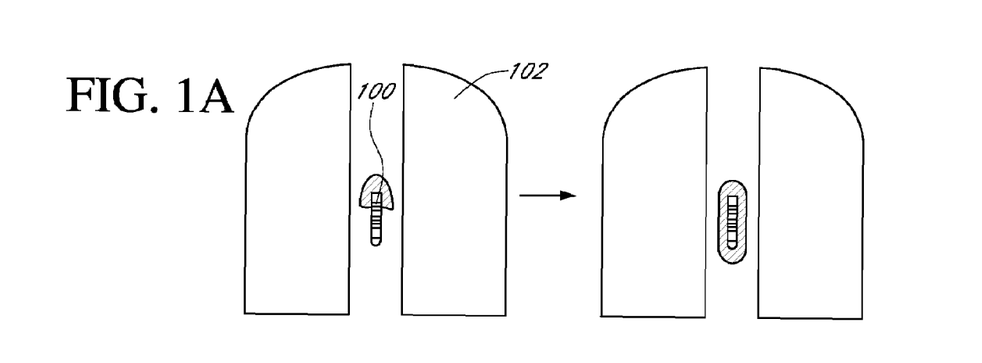
FIGS. 1A-1D depict four examples where static magnetic field inhomogeneity may need to be corrected in NMR and MRI applications.
Figure 1B:
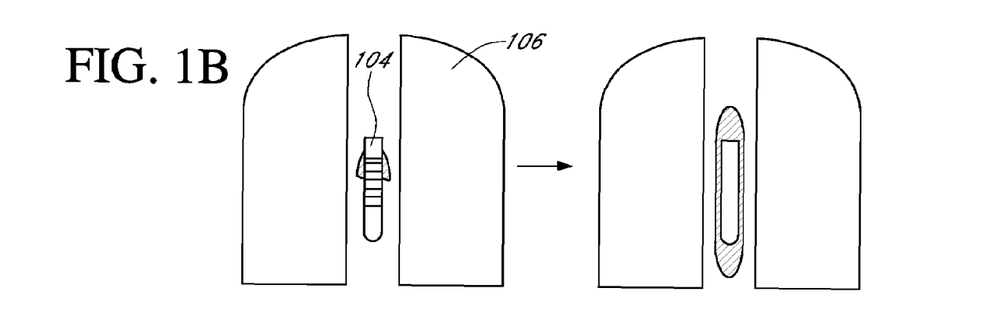
Figure 1C:
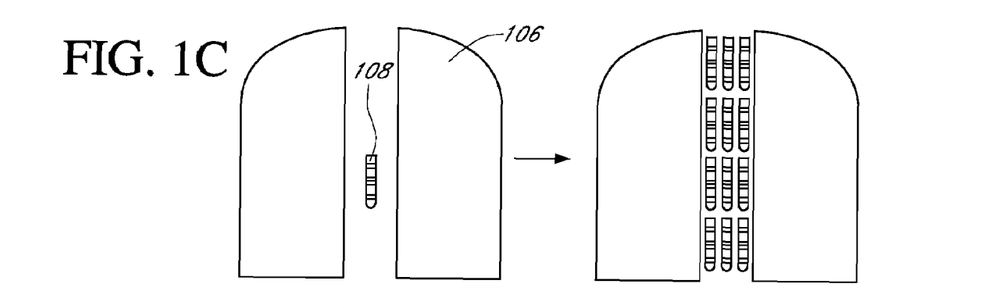
Figure 1D:
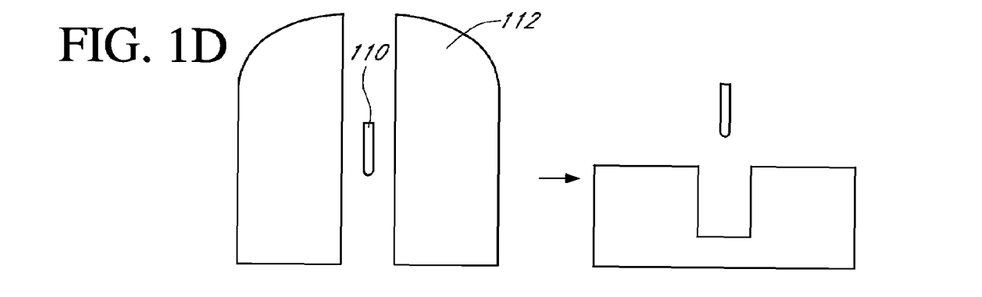

FIGS. 1A-1D depict four embodiments where the methods and systems disclosed herein may be used to counteract the effects caused by inhomogeneities in static magnetic field. In FIG. 1A, a system is used where the static magnetic field is not homogeneous at the sample location 100 within the magnet bore because a cheaper magnet 102 or little or no shim coils are used. By using the methods disclosed herein, the effects of the inhomogeneity can be compensated for to obtain a high quality signal. In FIG. 1B, a system is used where the sample 104 is too large to fit within the homogeneous region of the static magnetic field generated by a high quality magnet 106. The methods disclosed herein may be used to extend the capability of such systems (e.g., an existing NMR or MRI machine) in order to detect signals from larger sample sizes. In FIG. 1C, a system is used where the static magnetic field generated is homogeneous enough to measure a single sample 108 that is small enough to fit within a region of homogeneous magnetic field. However, the methods disclosed herein may be used to allow simultaneous measurement of multiple such samples within the bore of the magnet 106, even though the magnetic field homogeneity does not extend throughout the entire region. In FIG. 1D, a system is used where the sample 110 is placed in a location other than within a volume substantially enclosed by the magnet 112. Although the static magnetic field at such a location may not be homogeneous, the methods disclosed herein may be used to compensate for the effects of the inhomogeneity, allowing high quality detection. Those of skill in the art will recognize many other configurations and systems where the methods disclosed herein can be used to improve nuclear magnetic resonance detection in the presence of inhomogeneous magnetic fields.

In one embodiment, the dephasing effects caused by an inhomogeneous static magnetic field generated within a volume substantially enclosed by a magnet may be counteracted by applying radio frequency pulses from inhomogeneous radio frequency coils that are spatially matched to the static magnetic field. In another embodiment, the dephasing effects caused by an inhomogeneous static magnetic field generated within a volume substantially enclosed by a magnet may be counteracted by applying a magnetic field gradient from inhomogeneous gradient coils that are spatially matched to the static magnetic field. In still another embodiment, the dephasing effects caused by an inhomogeneous static magnetic field generated by a magnet, either within a volume substantially enclosed by a magnet or outside of the geometry of the magnet, may be counteracted by applying radio frequency pulses in combination with magnetic field gradients. In various embodiments, the amount of inhomogeneity compensated for by the methods and systems disclosed herein are at least about 0.3 ppm, at least about 0.5 ppm, at least about 0.8 ppm, or at least about 1 ppm.

Correcting of $B_0$ Inhomogeneity Using Spatially Matched Inhomogeneous RF Coils and RF Pulse Sequences In one embodiment, spatially matched inhomogeneous rf coils are used to counteract static magnetic field inhomogeneity. The spatial matching between the static field and the set of rf coils guarantees a correlation of the fields and the possibility of mutual canceling of their effects. The effects of an inhomogeneous static or rf field are similar and lead to dephasing in their respective frames of reference. Z-rotation composite or adiabatic pulses may be used to compensate for these dephasings and can produce inhomogeneity free NMR spectra in the presence of inhomogeneous field. Relevant information is preserved because, contrary to what happens during free evolution periods, the dephasing due to chemical shift differences is negligible during the irradiation period: the rf pulses only eliminate the dephasing induced by the static field gradient. Separate coils can be used for detection, or alternatively other detection methods could be implemented without loss of information.

Figure 2:
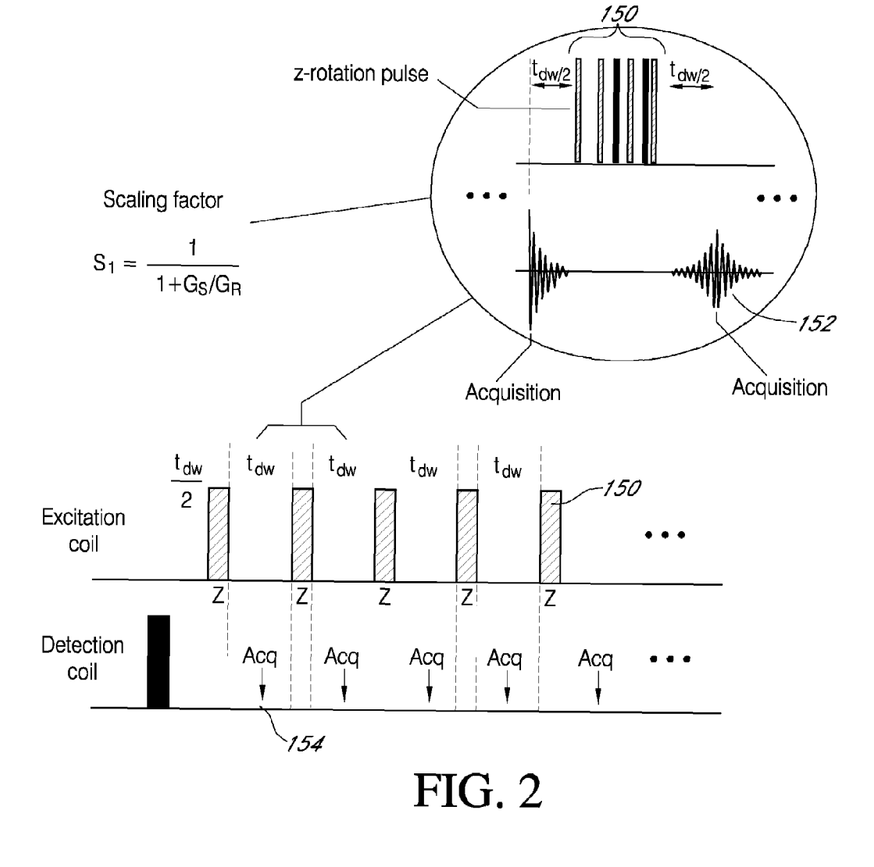
FIG. 2 depicts application of spatially matched inhomogeneous z-rotation pulses for compensation of magnetic field inhomogeneity in NMR and MRI systems.

FIG. 2 depicts one such embodiment. A spatially matched inhomogeneous rf excitation coil may be provided to apply z-rotation pulses 150 to the sample. The excitation pulse scheme can be broadband or selective over a region of special interest. Such a region could be for example a region of good correlation between the static and rf fields. The z-rotation pulses may comprise a windowed or windowless pulse train to cancel periodically the effects of inhomogeneities, giving rise to nutation echoes maxima. An rf detection coil may then be used to acquire inhomogeneity free FIDs 152 at the nutation echoes maxima times 154. Fourier transformation of the FIDs will yield an inhomogeneity free NMR spectrum. In some embodiments, the pulse sequence can incorporate pulses from several spatially matched rf coils in order to compensate for higher order inhomogeneity effects.

Correcting of $B_0$ Inhomogeneity Using Spatially Matched Inhomogeneous Gradient Coils and RF Pulse Sequences In another embodiment, spatially matched inhomogeneous gradient coils may used to apply a magnetic field gradient to a sample in an inhomogeneous static magnetic field in order to compensate for the inhomogeneity of the static field. The coil may serve to temporally increment the field inhomogeneity of the static field in the detection region. However, it should preserve the general functional dependence of the static field in the area. In other words, the magnetic field created by the gradient coil should match the static field inhomogeneity profile. Ideally, the average contribution of this "refocusing field" in the zone is zero.

Figure 3:
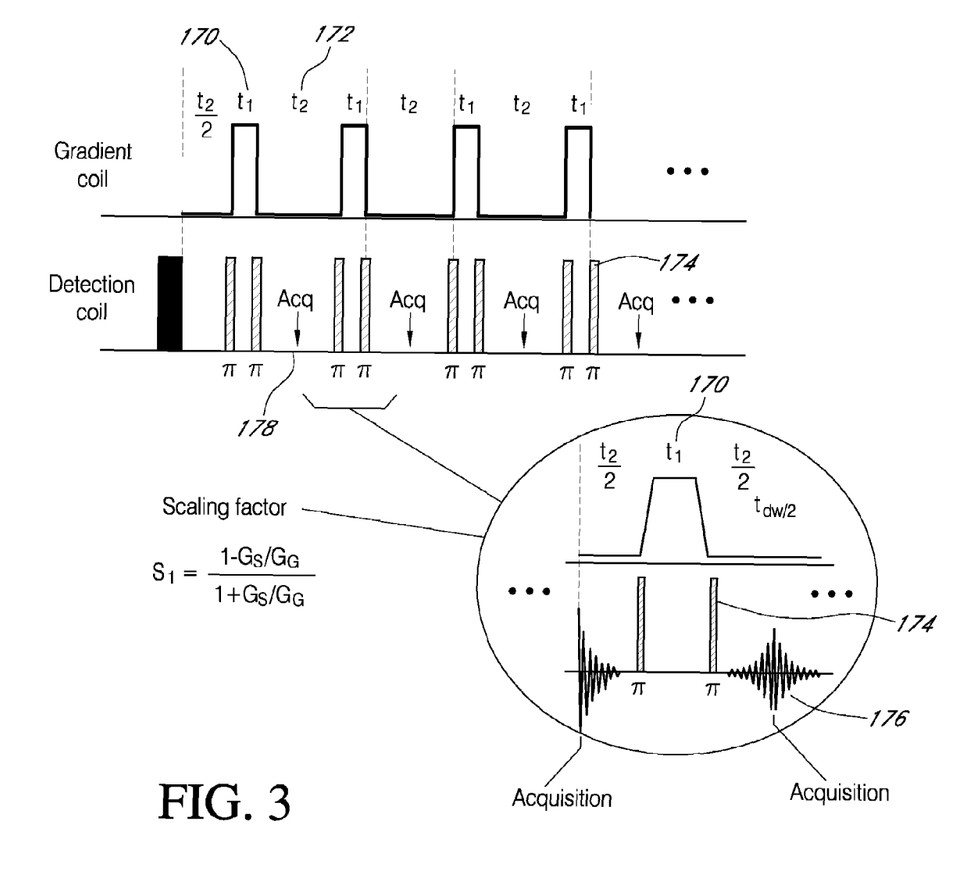
FIG. 3 depicts application of magnetic field gradient pulses for compensation of magnetic field inhomogeneity in NMR and MRI systems.

FIG. 3 depicts one such embodiment. An interval in which the gradient field is on 170 follows an interval of free evolution 172. Before and after switching the gradient coil on and off, respectively, inversion pulses (e.g., 7l pulses 174) may be applied to generate nutation echoes. Because, by construction, this coil increases the total field inhomogeneity, the duration of the interval with the coil on (e.g., $t_1$) is advantageously shorter than the interval of free-evolution (e.g., $t_2$). As a result, the amplitude of the echoes becomes modulated by a residual dephasing due to the chemical shift. Detection of FIDs 176 at the echo centers 178 leads to the reconstruction of the high-resolution spectrum.

In principle, temporal evolution is slower when using spatially matched inhomogeneous magnetic field coils as compared to spatially matched inhomogeneous rf coils because the chemical-shift induced dephasing is partially inverted during the refocusing period when applying the spatially matched magnetic field. As depicted in FIGS. 2 and 3, the scaling factors ($S_1$) for each method may be calculated as a function of the ratio between the gradient of the refocusing field ($G_G$) and the gradient of the static field ($G_S$). For a fixed value of this ratio, using spatially matched inhomogeneous rf coils provides a higher scaling factor. However, because the gradient coil does not need to be part of a tuned circuit, its geometry and number of turns can substantially differ from those used in an rf excitation coil. Thus, the produced gradient amplitude could be considerably higher than amplitudes generated by rf coils.

"Shim Pulses"—Correction of $B_0$ Inhomogeneity Using Time-Dependent $B_0$ Gradient Pulses and RF Pulse Sequences In one embodiment, spatially uniform rf pulses are applied simultaneously with magnetic field gradients to compensate for static magnetic field inhomogeneity. In such "shim pulses," the rf coil and magnetic gradient coils do not need to be spatially matched to the static magnetic field. The frequency and amplitude of the rf signal during application of the pulse may be made to vary with time. Similarly, the amplitude of the magnetic field gradient may vary with time during application of the pulse. Static field gradients produced by gradient coils impose a spatial dependence of the spin precession frequency. Frequency selective rf pulses applied in the presence of $B_0$ gradients thus affect spins in a spatially selective way. An adiabatic full passage of an rf pulse induces a $B_0$-dependent phase shift, which is canceled by a second passage if $B_0$ remains the same. By changing the $B_0$ gradients during the two passages the phase of the spins are affected with a magnitude that depends on position in space. Conditions can be achieved where the imposed phase shift exactly cancels the phase shift originating from the $B_0$ field imperfections. The applied $B_0$ give the spatial selectivity, the change of the $B_0$ gradients with time determines the amount and shape of the correction, and the adiabatic double passage is the "engine" with which the correction is driven. A constant magnetic field gradient provides linear corrections to the magnetic field inhomogeneity. Time dependence of the applied gradients make higher order corrections possible. 3D inhomogeneity can be corrected by simultaneously applying $B_0$ gradients in three directions. In one embodiment, linear gradients are applied in three orthogonal directions and a homogeneous rf sweep is applied.

An NMR spectrum free from the broadening caused by imperfect $B_0$ can be obtained by the application of an rf-pulse with $B_0$ gradients between each detected point in the time-domain NMR signal. One or more "shim pulses" as described above may be applied in a pulse train with FID acquisition between each series of pulses. In another embodiment, the "shim pulses" may be applied between acquisitions during magnetic resonance imaging.

In one embodiment, coils may be used to detect and map the inhomogeneity in the static magnetic field. Using the mapped inhomogeneity, the appropriate application of rf pulses and magnetic field gradients may be numerically determined to compensate for the inhomogeneity. In one embodiment, the same coils as used to apply the magnetic field gradients may be used to detect and map the inhomogeneity.

Shim Pulse Systems

Figure 4:
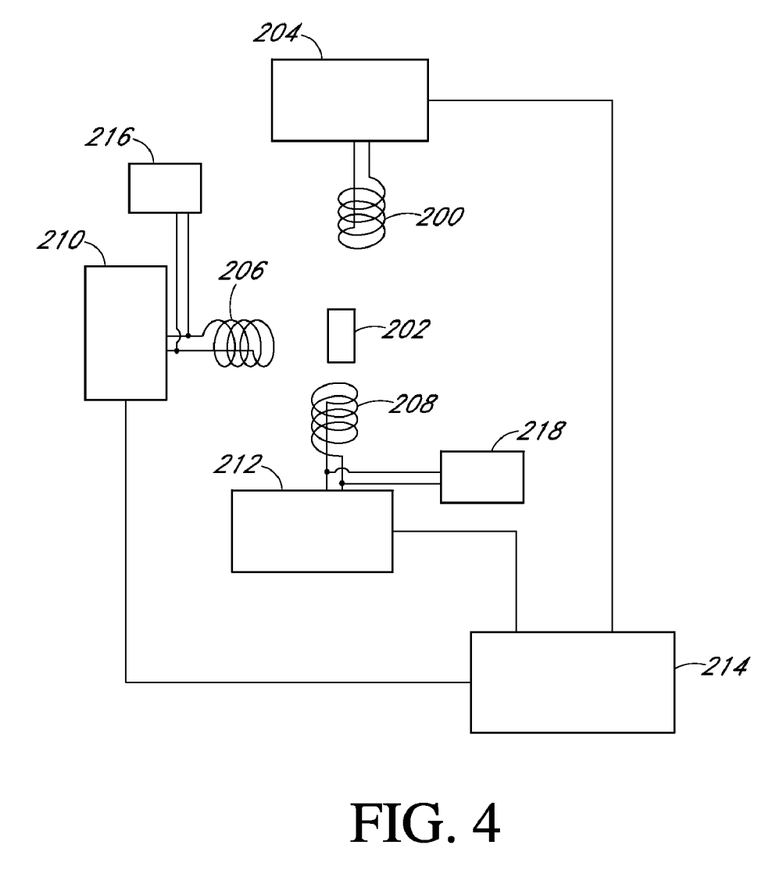
FIG. 4 depicts a system comprising radio frequency coils and magnetic field gradient coils for applying "shim pulses" to compensate for magnetic field inhomogeneity in NMR and MRI systems.

In one embodiment, a system for applying compensating rf pulses and magnetic field gradients is provided. FIG. 4 depicts one such embodiment. A radio frequency coil 200 is provided to apply homogeneous rf signals to sample 202. A current generating module 204 is coupled to the radio frequency coil 200 for driving current through the coil 200. The current generating module 204 may be adapted to apply rf pulses that sweep across a desired time-modulated frequency and amplitude such that the effects of inhomogeneity in a static magnetic field passing through the sample 202 may be compensated for. Multiple magnetic field gradient coils 206 and 208 are provided. In one embodiment, the coils 206 and 208 are positioned orthogonal to each other. The magnetic field gradient coils 206 and 208 are coupled to current generating modules 210 and 212 for driving current through the coils 206 and 208. The current generating modules 210 and 212 may be adapted to apply time-modulated magnetic field gradients through the sample 202 such that when combined with the rf pulses from the rf coil 200, the effects of inhomogeneity in a static magnetic field passing through the sample 202 may be compensated for. In one embodiment, a computation module 214, such as a general purpose computer, may be coupled to the current generating modules 204, 210, and 212 for computing the current waveforms that need to be applied by the modules 204, 210, and 212 so that inhomogeneity compensating pulses and gradients are applied.

In one embodiment, current measurement modules 216 and 218 may be coupled to the magnetic field gradient coils 206 and 208 so that the static magnetic field may be measured by the coils 206 and 208. The computation module 214 may receive the current measured by the modules 216 and 218 as input so that it can map the inhomogeneity of the static magnetic field through the sample 202. The computation module 214 may then numerically calculate the current needed to be applied by current generating modules 204, 210, and 212 in order to compensate for the inhomogeneity.

In one embodiment, the sample 202 and coils 200, 206, and 208 may be placed within a volume substantially enclosed by a magnet that generates a static magnetic field. The inhomogeneities in the field generated by the magnet may be compensated for using the coils 200, 206, and 208. In another embodiment, the sample 202 and coils 200, 206, and 208 may be placed outside of a volume substantially enclosed by a magnet. In one embodiment, a sample holder is supplied to hold the sample in a desired position relative to the coils 200, 206, and 208. In one embodiment, an rf probe coil is proved for detecting nuclear magnetic resonance signals from the sample. Those of skill in the art will recognize many probe coil designs suitable for this purpose.

EXAMPLES

Example 1

2D Simulated Quadratic Inhomogeneity (Saddle Shaped)

Figure 5:
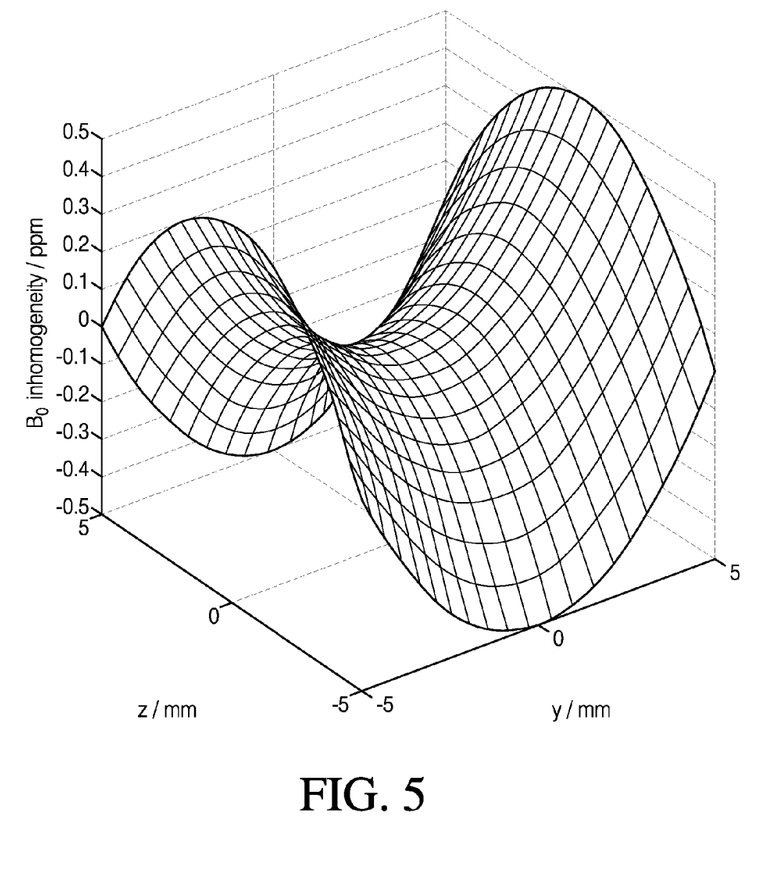
FIG. 5 depicts a simulated 2D saddle-shaped quadratic magnetic field inhomogeneity.
Figure 6A:
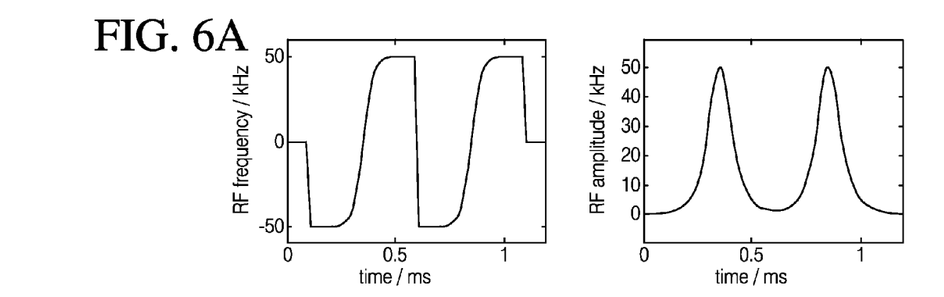
FIG. 6A depicts a time-modulated rf pulse frequency sweep useful for compensating for the inhomogeneity depicted in FIG. 5.
Figure 6B:
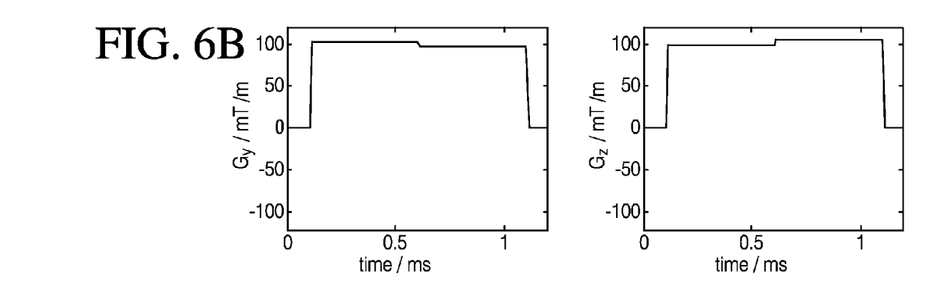
FIG. 6B depicts a time-modulated magnetic field gradient useful for compensating for the inhomogeneity depicted in FIG. 5.
Figure 6C:
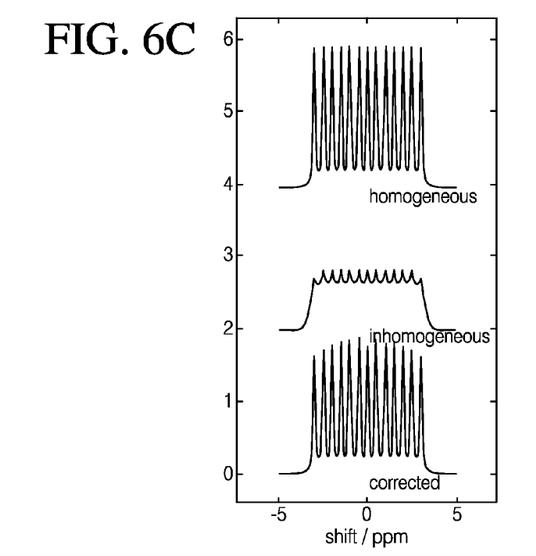
FIG. 6C depicts the effect on NMR spectra by applying the pulses depicted in FIGS. 6A and 6B.

FIG. 5 depicts a simulated saddle shaped 2D $B_0$ inhomogeneity in the y,z-plane. Extension to 3D is straightforward. A 1×1 cm sample is located in a $B_0$ field with a saddle-shaped quadratic inhomogeneity with 1 ppm difference between the extremes. This inhomogeneity is sufficient to degrade the chemical shift resolution. Static linear $B_0$ gradients are not capable of correcting the quadratic inhomogeneity. Similarly, two adiabatic radio frequency pulses of the hyperbolic secant type applied in the presence of static $B_0$ gradients will have no net effect if the rf pulse sweeps through the sample twice. In contrast, FIGS. 6A-6C depict application of compensating shim pulses. An rf frequency sweep having hyperbolic secant shape and indicated amplitude is swept twice through the sample (FIG. 6A). The y and z magnetic field gradients are modulated as depicted in FIG. 6B during application of the rf sweeps. The phase spread originating from the quadratic inhomogeneity is canceled yielding an NMR spectrum of a quality comparable to the one that would be obtained in a homogeneous $B_0$ field (FIG. 6C). Subtle changes of the gradient strengths during the two frequency sweeps are sufficient to correct this particular $B_0$ imperfection.

Example 2

2D Simulated Quadratic Inhomogeneity (Radial Symmetry)

Figure 7:
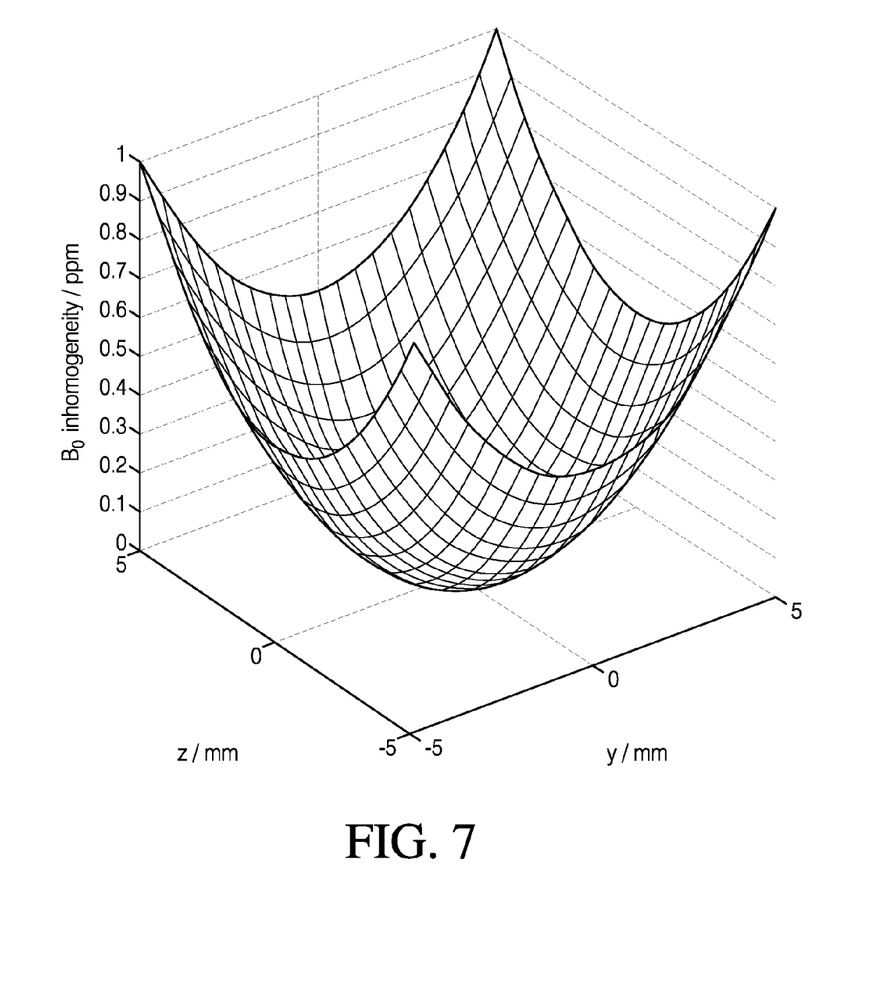
FIG. 7 depicts a simulated 2D quadratic magnetic field inhomogeneity with radial symmetry.
Figure 8A:
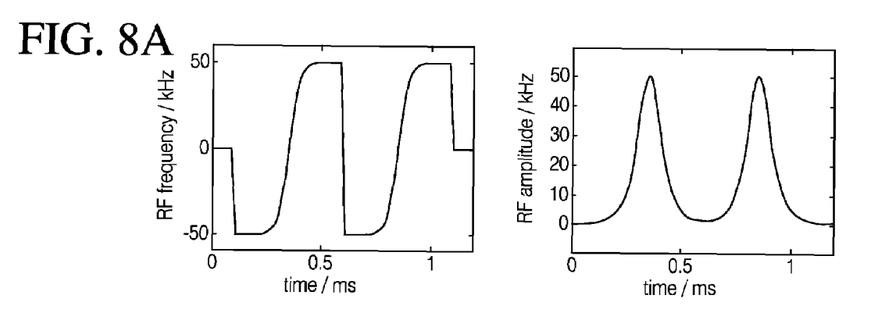
FIG. 8A depicts a time-modulated rf pulse frequency sweep useful for compensating for the inhomogeneity depicted in FIG. 7.
Figure 8B:
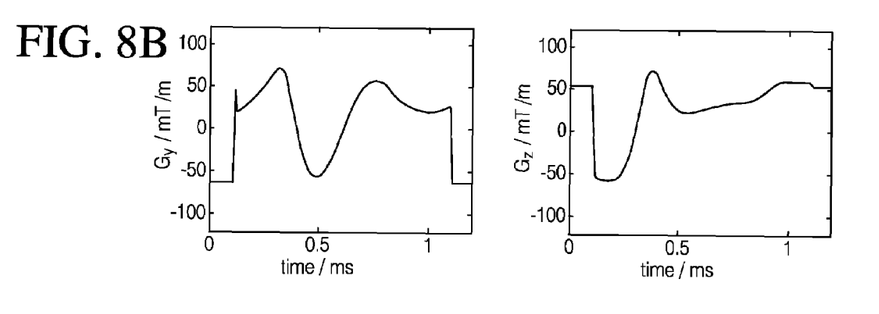
FIG. 8B depicts a time-modulated magnetic field gradient useful for compensating for the inhomogeneity depicted in FIG. 7.
Figure 8C:
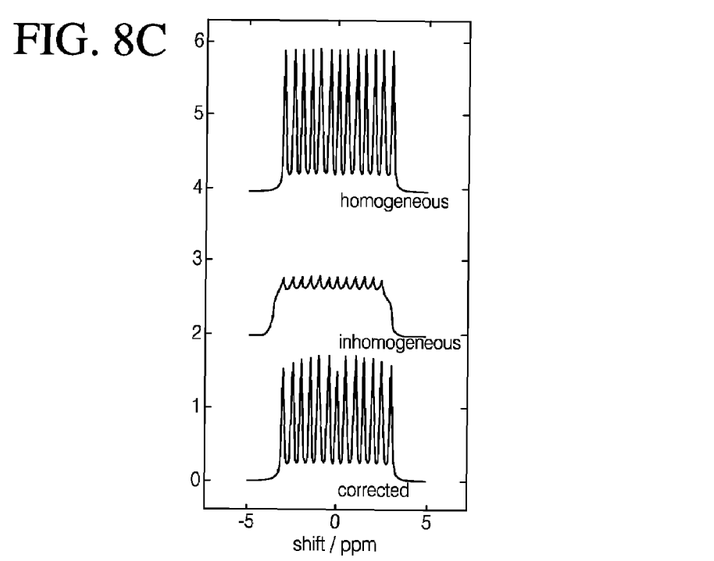
FIG. 8C depicts the effect on NMR spectra by applying the pulses depicted in FIGS. 8A and 8B.

FIG. 7 depicts a simulated quadratic 2D $B_0$ inhomogeneity with radial symmetry in the y,z-plane. Extension to 3D is straightforward. In contrast to the previous example, this inhomogeneity cannot be considered as a superposition of 1D inhomogeneities. However, two orthogonal linear $B_0$ gradients are capable of correcting this non-linear inhomogeneity. In this case a continuous modulation of the gradients is necessary in order to guide the RF frequency sweep through the sample. Again, a hyperbolic secant frequency sweep is applied (FIG. 8A). However, the y and z magnetic field gradients are continuously modulated (FIG. 8B). The result is that the inhomogeneity is compensated for, yielding a quality NMR spectrum (FIG. 8C).

Example 3

Inhomogeneity Compensation in Vitamin $B_1$ Spectrum

Figure 9A:
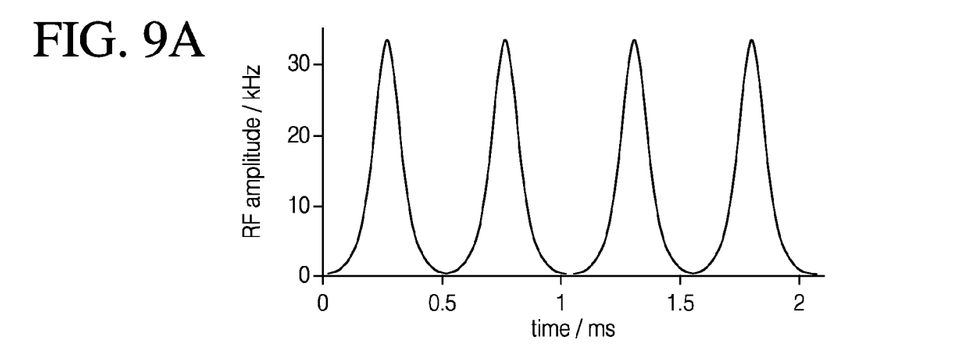
FIG. 9A depicts time-modulated radio frequency amplitude pulses useful for compensating for quadratic magnetic field inhomogeneity.
Figure 9B:
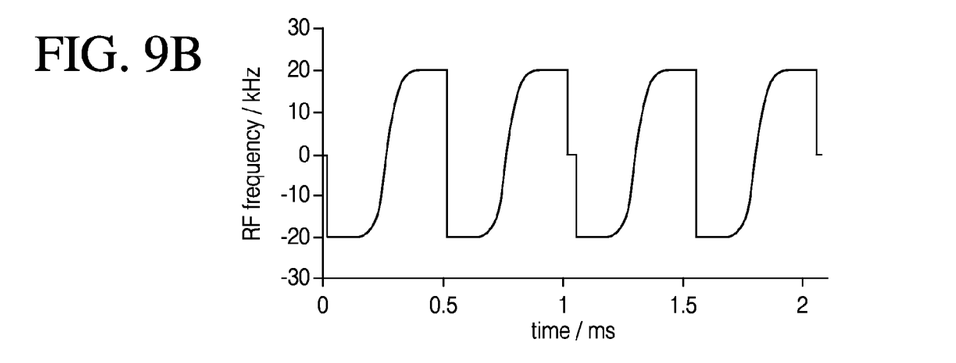
FIG. 9B depicts an adiabatic frequency sweep in time-modulated radio frequency pulses useful for compensating for quadratic magnetic field inhomogeneity.
Figure 9C:
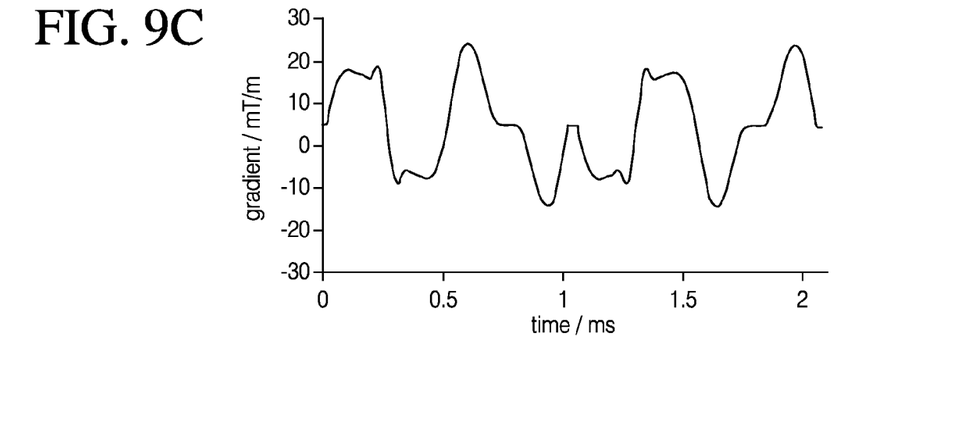
FIG. 9C depicts a time-modulated magnetic field gradient useful for compensating for quadratic magnetic field inhomogeneity.

A Bruker Avance-700 NMR spectrometer with a triple resonance probe was used to measure the NMR spectrum of 5 mg/ml thiamine hydrochloride (vitamin $B_1$) in $D_2O$ in a standard 5 mm sample tube. The probe contained x, y, and z gradient coils for multiple quantum coherence selection. The signal from the residual $^1H$ in the $D_2O$ was suppressed by accumulating 64 transients with a recycle delay which was short in comparison to the relaxation time of water. The main magnetic field was made inhomogeneous by misadjusting the $z^1$ and $z^2$ shim coils. A z-gradient modulation was numerically optimized to give rise to a quadratic phase shift across the z-axis of the sample volume. This modulation was added to a constant gradient to provide simultaneous linear and quadratic corrections. A homogeneous rf pulse was simultaneously applied consisting of four identical sech/tanh adiabatic passages sweeping a frequency range of 40 kHz with a peak rf amplitude of 33 kHz. FIGS. 9A-9C depict the resulting shim pulse with time-modulated rf amplitude (FIG. 9A), time-modulated rf frequency (FIG. 9B), and time-modulated magnetic field gradient (FIG. 9C).

Figure 10A:
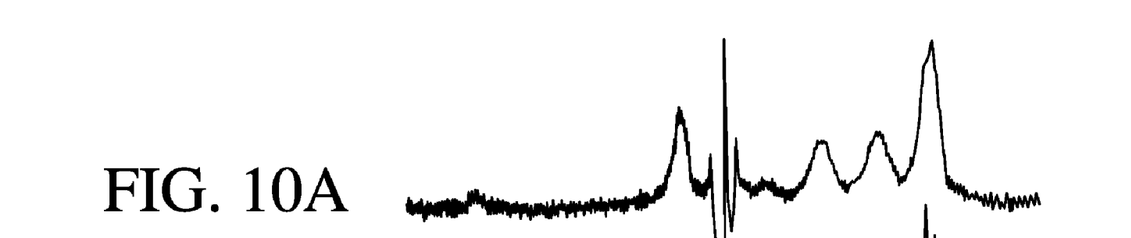
FIG. 10A depicts an NMR spectrum of thiamine hydrochloride in the presence of an inhomogeneous static magnetic field.
Figures 10B, 10C, 10D:
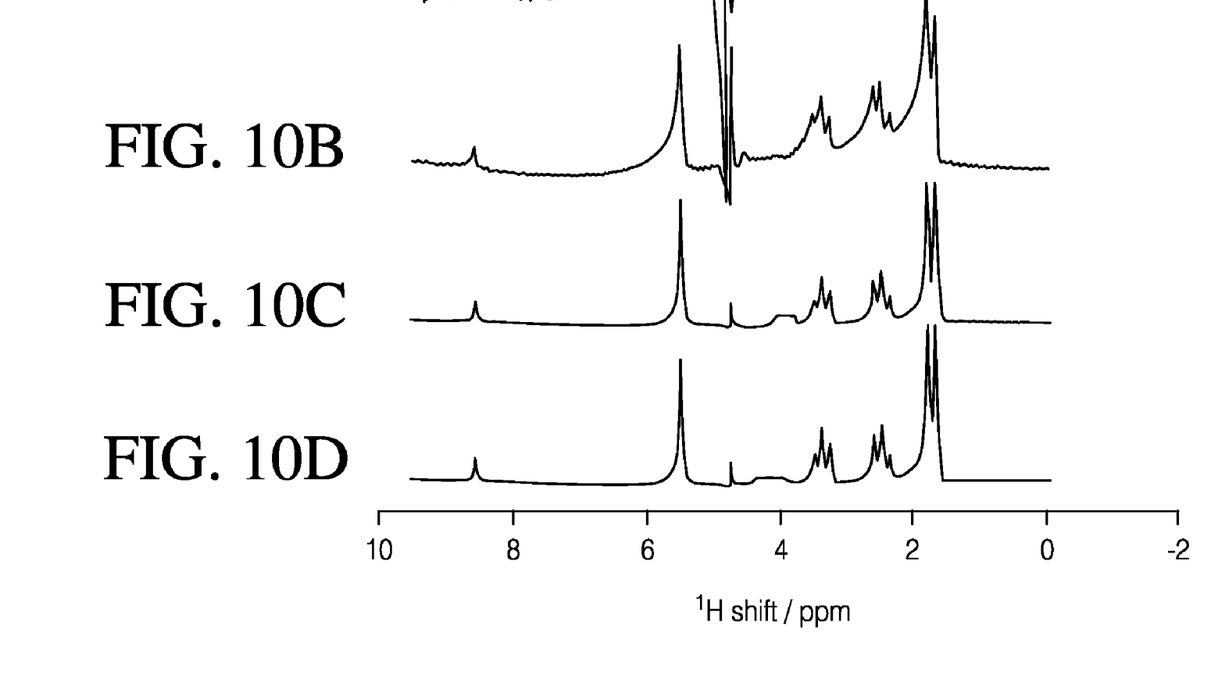
FIG. 10B depicts an NMR spectrum of thiamine hydrochloride in the presence of an inhomogeneous static magnetic field utilizing compensating shim pulses with a constant magnetic field gradient to correct only linear inhomogeneities.
FIG. 10C depicts an NMR spectrum of thiamine hydrochloride in the presence of an inhomogeneous static magnetic field utilizing compensating shim pulses with a time-modulated magnetic field gradient to correct linear and quadratic inhomogeneities.
FIG. 10D depicts an NMR spectrum of thiamine hydrochloride in the presence of a homogeneous static magnetic field.

The time domain NMR signal was recorded during a train of 1024 interleaved shim pulses and free precession delays. For each 2 ms shim pulse, 150 µs of chemical shift evolution took place. FIGS. 10A-10C depict NMR spectra obtained without inhomogeneity compensation (FIG. 10A), with linear corrections by applying a constant magnetic field gradient (FIG. 10B), with both linear and quadratic corrections by applying the time-modulated magnetic field of FIG. 9C (FIG. 10C), and with a properly shimmed homogeneous magnetic field (FIG. 10D). The spectrum obtained with inhomogeneous $B_0$ without correction has poor signal-to-noise ratio and lacks the fine details (FIG. 10A). A constant gradient corrects only for the $z^1$ term of the inhomogeneity yielding a spectrum with highly asymmetric peaks, which are typical for a $z^2$ inhomogeneity (FIG. 10B). With full gradient modulation, the homogeneous spectrum is recovered (FIG. 10C).

Although the invention has been described with reference to embodiments and examples, it should be understood that numerous and various modifications can be made without departing from the spirit of the invention. Accordingly, the invention is limited only by the following claims.

What is claimed is:

1. A method for detecting nuclear magnetic resonance of a sample in magnetic fields having at least about 0.5 ppm inhomogeneity in static magnetic field strength, the method comprising:
    applying a radio frequency pulse comprising a time-varying frequency sweep and a time-varying amplitude sweep to the sample; and
    simultaneously applying a time-varying magnetic field gradient to the sample.

2. The method of claim 1, further comprising determining a spatial map of the inhomogeneity in the static magnetic field prior to applying the radio frequency pulse and magnetic field gradient.

3. The method of claim 2, wherein determining the spatial map of the inhomogeneity comprises detecting the static magnetic field with one or more magnetic field coils that are also used to apply the magnetic field gradient.

4. The method of claim 1, wherein the applied magnetic field gradient is adapted to provide a non-linear correction to the static magnetic field inhomogeneity.

5. The method of claim 1, wherein the sample is not located within a volume substantially enclosed by a magnet.

6. The method of claim 1, wherein the sample is located within a volume substantially enclosed by a magnet of a nuclear magnetic spectrometer or magnetic resonance imager.

7. The method of claim 6, wherein the nuclear magnetic spectrometer or magnetic resonance imager does not comprise any shim magnets.

8. The method of claim 6, wherein any shim magnets in the nuclear magnetic spectrometer or magnetic resonance imager are permanent magnets.

9. The method of claim 1, further comprising detecting a nuclear magnetic resonance spectrum of the sample.

10. The method of claim 1, further comprising detecting a magnetic resonance image of the sample.

11. The method of claim 1, wherein the frequency and amplitude sweeps are adiabatic.

12. The method of claim 1, further comprising detecting nuclear magnetic resonance of the sample after application of the radio frequency pulse and magnetic field gradient.

13. The method of claim 1, wherein the radio frequency pulse is substantially spatially uniform.

14. A method for improving detection of a nuclear magnetic resonance signal from a sample in an inhomogeneous static magnetic field within a volume substantially enclosed by a magnet, the method comprising:
    applying a first radio frequency inversion pulse;
    after applying the first radio frequency inversion pulse, applying a magnetic field gradient spatially matched to the static magnetic field; and
    after applying the magnetic field gradient, applying a second radio frequency inversion pulse.

15. The method of claim 14, further comprising detecting the nuclear magnetic resonance signal during echoes of said inversion pulses.

16. The method of claim 14, further comprising detecting a nuclear magnetic resonance spectrum.

17. The method of claim 14, further comprising detecting a magnetic resonance image.

18. The method of claim 14, wherein the volume substantially enclosed by the magnet comprises a sample chamber in a nuclear magnetic resonance spectrometer or a magnetic resonance imager.

19. A system for improving detection of a nuclear magnetic resonance signal from a sample in an inhomogeneous static magnetic field, the system comprising:
    a radio frequency coil;
    one or more magnetic field generating coils;
    a first current generating module coupled to the radio frequency coil; and
    at least one second current generating module coupled to at least one of the magnetic field generating coils, wherein the first and second current generating modules are adapted to apply currents though the coils so that a radio frequency pulse and a time-varying magnetic field gradient are simultaneously applied in such a manner that effects of inhomogeneity in the static magnetic field are substantially counteracted.

20. The system of claim 19, wherein the radio frequency coil is adapted to generate spatially uniform radio frequency signals.

21. The system of claim 19, wherein the magnetic field generating coils are adapted to generate magnetic field gradients in three orthogonal directions.

22. The system of claim 19, further comprising at least one current measurement module coupled to the magnetic field generating coils, the current measurement modules adapted to detect inhomogeneity in the static magnetic field.

23. The system of claim 19, further comprising a magnet adapted to generate the static magnetic field.

24. The system of claim 23, further comprising a sample holder adapted to hold a sample within a volume substantially enclosed by the magnet.

25. The system of claim 23, further comprising a sample holder adapted to hold a sample outside of a volume substantially enclosed by the magnet.

26. The system of claim 19, further comprising a probe adapted to detect a nuclear magnetic resonance of a sample.

27. The system of claim 26, wherein the probe is adapted to detect a nuclear magnetic resonance spectrum of the sample.

28. The system of claim 26, wherein the probe is adapted to detect a magnetic resonance image of the sample.

29. The system of claim 19, wherein the first current generating module is adapted to apply current through the radio frequency coil such that a radio frequency pulse comprising a time-varying frequency is generated.

30. A system for detecting a magnetic resonance signal, comprising:

means for applying a static magnetic field to a sample;

means for generating a time-varying magnetic field gradient;

means for generating a radio frequency (RF) pulse simultaneously with the time-varying magnetic field gradient in such a manner that effects of inhomogeneity in the static magnetic field generated by the means for applying the static magnetic field are substantially counteracted; and means for detecting a magnetic resonance signal from the sample.

\* \* \* \* \*

UNITED STATES PATENT AND TRADEMARK OFFICE
CERTIFICATE OF CORRECTION

PATENT NO. : 7,439,738 B2
APPLICATION NO. : 11/625209
DATED : October 21, 2008
INVENTOR(S) : Alexander Pines et al.

It is certified that error appears in the above-identified patent and that said Letters Patent is hereby corrected as shown below:

Title page item (56), page 2, column 1, line 21, please delete "Phyics," and insert --physics,-- therefor.

Title page item (56), page 2, column 2, line 13, please delete "Chemcial" and insert --Chemical-- therefor.

Column 1, line 59, please delete "Sakellanou," and insert --Sakellariou-- therefor.

Column 6, line 12, please delete "7l pulses" and insert --$\pi$ pulses-- therefor.

Claim 19, column 10, line 29, please delete "though" and insert --through-- therefor.

Signed and Sealed this

Twentieth Day of October, 2009

David J. Kappos
*Director of the United States Patent and Trademark Office*